United States Patent
Tang et al.

(10) Patent No.: US 7,826,181 B2
(45) Date of Patent: Nov. 2, 2010

(54) MAGNETIC MEMORY WITH POROUS NON-CONDUCTIVE CURRENT CONFINEMENT LAYER

(75) Inventors: Michael Xuefei Tang, Bloomington, MN (US); Ming Sun, Eden Prairie, MN (US); Dimitar V. Dimitrov, Edina, MN (US); Patrick Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 71 days.

(21) Appl. No.: 12/269,537

(22) Filed: Nov. 12, 2008

(65) Prior Publication Data

US 2010/0117170 A1    May 13, 2010

(51) Int. Cl.
G11B 5/33    (2006.01)
G11B 5/127    (2006.01)

(52) U.S. Cl. .................. 360/324.1; 257/E21.001; 257/E29.323; 365/151; 438/3; 438/48

(58) Field of Classification Search ............... 257/421, 257/295, E21.001, E29.323; 360/324.1, 360/324.11, 324.12, 314; 438/3, 48; 365/126, 365/145, 151
See application file for complete search history.

(56) References Cited

U.S. PATENT DOCUMENTS

| 5,761,115 A | 6/1998 | Kozicki |
|---|---|---|
| 6,985,378 B2 | 1/2006 | Kozicki |
| 7,093,347 B2 | 8/2006 | Nowak |
| 7,189,435 B2 | 3/2007 | Tuominen |
| 7,430,135 B2 | 9/2008 | Huai |
| 7,518,835 B2 | 4/2009 | Huai |
| 7,576,956 B2 | 8/2009 | Huai |
| 2006/0060832 A1 | 3/2006 | Symanczyk |
| 2006/0063052 A1* | 3/2006 | Hu et al. ............... 429/30 |
| 2006/0245117 A1 | 11/2006 | Nowak |
| 2007/0171694 A1 | 7/2007 | Huai |
| 2008/0026253 A1* | 1/2008 | Yuasa et al. ............ 428/811 |
| 2008/0061388 A1 | 3/2008 | Diao |
| 2008/0180991 A1 | 7/2008 | Wang |
| 2008/0191251 A1* | 8/2008 | Ranjan et al. ........... 257/295 |
| 2009/0302403 A1 | 12/2009 | Nguyen |

OTHER PUBLICATIONS

Yan et al., "Magnesium oxide as a candidate high- k gate dielectric", 2006, Applied Physics Lett., vol. 88, pp. 142901-1-142901-3.*
Wendt et al., "Electronic and vibrational properties of ultrathin SiO2 films grown on Mo(112)", 2005, Phys. Rev., vol. B72, pp. 1150409-1-115409-9.*

(Continued)

*Primary Examiner*—Thomas L Dickey
*Assistant Examiner*—Nikolay Yushin
(74) *Attorney, Agent, or Firm*—Campbell Nelson Whipps LLC

(57) ABSTRACT

A magnetic element having a ferromagnetic pinned layer, a ferromagnetic free layer, a non-magnetic spacer layer therebetween, and a porous non-electrically conducting current confinement layer between the free layer and the pinned layer. The current confinement layer forms an interface either between the free layer and the non-magnetic spacer layer or the pinned layer and the non-magnetic spacer layer.

19 Claims, 5 Drawing Sheets

OTHER PUBLICATIONS

U.S. Appl. No. 12/106,382, filed Apr. 21, 2008, Inventors: Xi et al.
U.S. Appl. No. 12/170,519, filed Jul. 10, 2008, Inventors: Xi et al.
U.S. Appl. No. 12/269,507, filed Nov. 12, 2008, Inventors: Tian et al.
U.S. Appl. No. 12/269,514, filed Nov. 12, 2008, Inventors: Venkatasamy et al.
W.W. Zhuang et al., Tech Dig. IEDM (2002) 193.
G.I. Baek et al., Tech. Dig. IEDM (2005) 750.
G.I. Baek et al., Tech. Dig. IEDM (2004) 587.
T. Thurn-Albrecht et al., Science, 290, 2126 (2000).
Hideki Masuda and Kenji Fukuda, Science, 268, 1466 91995), (1995).
Masuda et al., Ordered Metal Nanohole Arrays Made by a Two-Step Replication of Honeycomb Structures of Anodic Alumina, Science, Ol. 268, Jun. 9, 1995.
Song-Zhu Chu et al., Fabrication of Ideally Ordered Nanoporous Alumina Films and Integrated Alumina Nanotubule Arrays by High-Field Anodization, Adv. Mater. 2005, 17, 2115-2119.
Macak et al., High-Aspect-Ratio $TiO_2$, Nanotubes by Anodization of Titanium, Angew. Chem. Int. Ed. 2005, 44, 2100-2102.
A. Huczko, Template-Based Synthesis of Nanomaterials, Appl. Phys. A 70, 365-376 (2000).

* cited by examiner

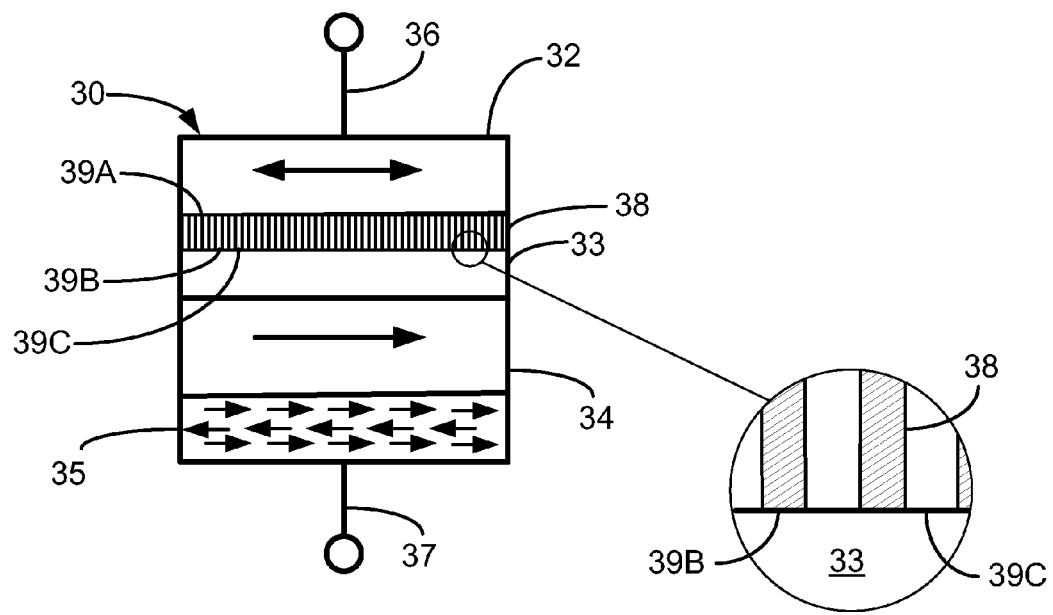
FIG. 3
FIG. 3A
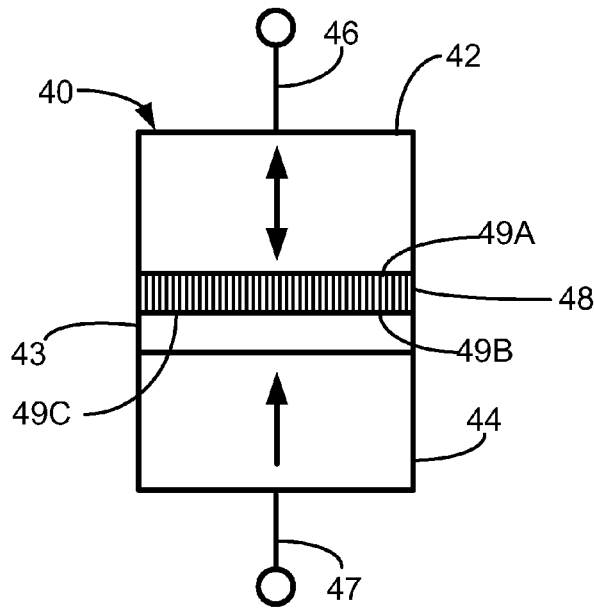
FIG. 4

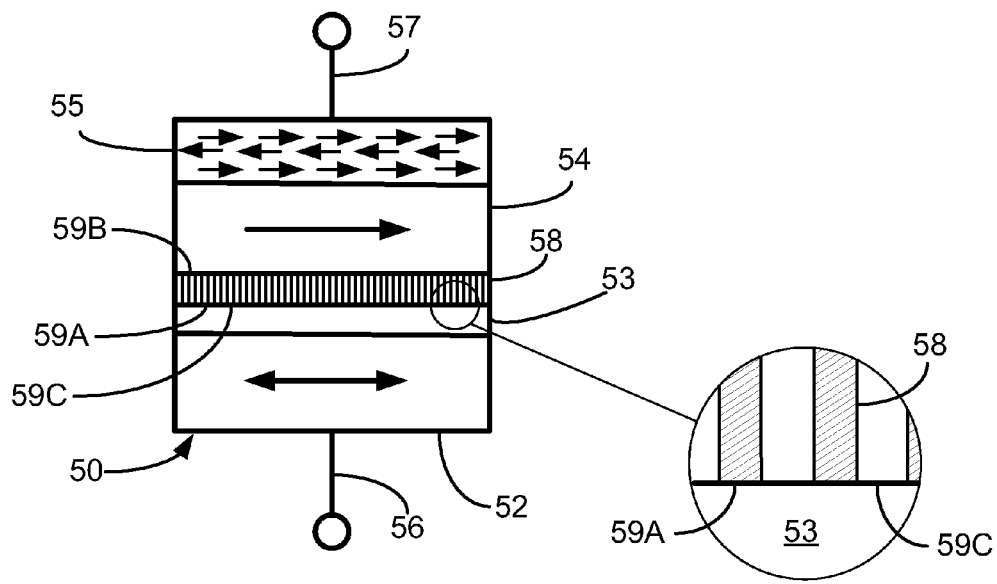
FIG. 5
FIG. 5A
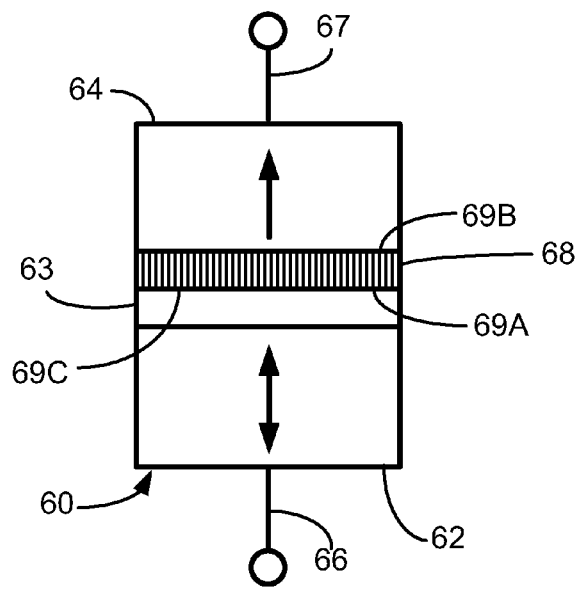
FIG. 6

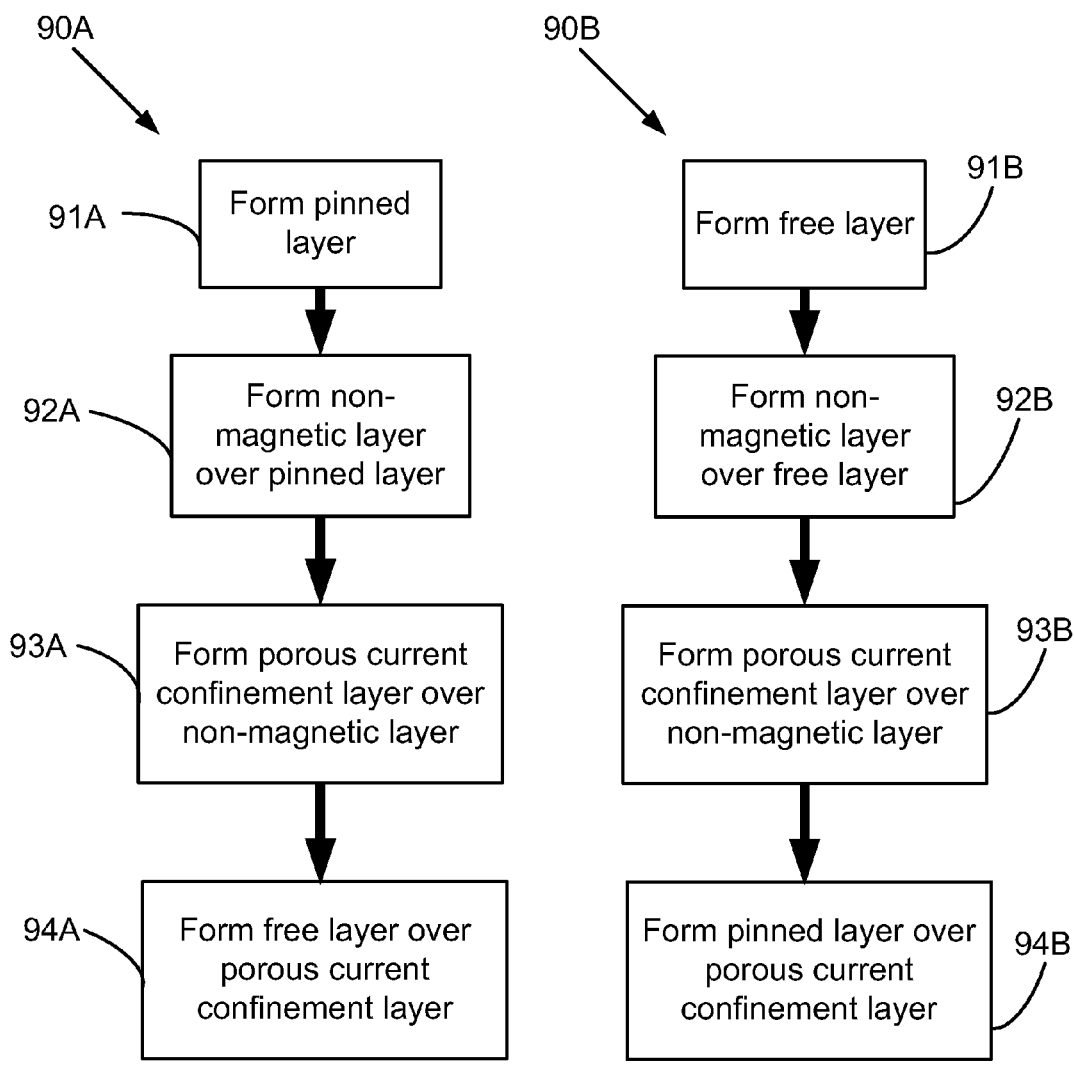

MAGNETIC MEMORY WITH POROUS NON-CONDUCTIVE CURRENT CONFINEMENT LAYER

BACKGROUND

Spin torque transfer technology, also referred to as spin electronics, which is based on changing magnetic state of the system by momentum transfer from conduction electrons, is a recent development. Spin torque RAM or ST RAM is a non-volatile random access memory application that utilizes spin torque technology. Digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer (PL), and a ferromagnetic free layer (FL), each having a magnetization orientation. The magnetic element also includes a non-magnetic barrier layer. The respective magnetization orientations of the free layer and the pinned layer define the resistance of the overall magnetic element. When the magnetization orientations of the free layer and pinned layer are parallel, the resistance of the element is low ($R_L$). When the magnetization orientations of the free layer and the pinned layer are antiparallel, the resistance of the element is high ($R_H$). The magnetization orientation is switched by passing a current perpendicularly through the layers. The current direction is different for writing "1" or "0". To write "1" ($R_H$) the current flows from the pinned layer to the free layer, and reversed to flow from the free layer to the pinned layer to write "0" ($R_L$).

It is desirous to reduce the switching current needed to switch the free layer magnetization orientation, since larger chip capacity and/or reduced power consumption is achieved.

BRIEF SUMMARY

This present disclosure is directed to magnetic elements, such as tunneling magnetoresistive elements, that include a current confinement layer. The magnetic elements have a plurality of layers including a porous non-conductive current confinement layer. Utilizing such a current confinement layer increases the current density within the current path in the free layer of the element, thus reducing the switching current of the element.

In one particular embodiment, this disclosure provides a magnetic element having a ferromagnetic pinned layer, a ferromagnetic free layer, a non-magnetic spacer layer therebetween, and a porous non-electrically conducting current confinement layer between the free layer and the pinned layer. The current confinement layer may be between the free layer and the non-magnetic spacer layer, providing an interface between the free layer and the non-magnetic spacer layer, or the current confinement layer may be between the pinned layer and the non-magnetic spacer layer, providing an interface between the pinned layer and the non-magnetic spacer layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 3 is a cross-sectional schematic diagram of a first embodiment of a magnetic element having a current confinement layer; FIG. 3A is an enlarged view of a portion of the magnetic element of FIG. 3;

FIG. 4 is a cross-sectional schematic diagram of a second embodiment of a magnetic element having a current confinement layer;

FIG. 5 is a cross-sectional schematic diagram of a third embodiment of a magnetic element having a current confinement layer; FIG. 5A is an enlarged view of a portion of the magnetic element of FIG. 5;

FIG. 6 is a cross-sectional schematic diagram of a fourth embodiment of a magnetic element having a current confinement layer;

FIG. 9A is a flow diagram of a method of making a magnetic element having a current confinement layer; and FIG. 9B is a flow diagram of a method of making a magnetic element having a current confinement layer.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to magnetic elements having a current confinement layer within the stack. The construction can be used for both in-plane magnetic elements where the magnetization orientation of the magnetic layer is in the stack film plane and out-of-plane magnetic elements where the magnetization orientation of the magnetic layer is out of the stack film plane, e.g., perpendicular to the stack plane. The current confinement layer is a porous non-conductive layer present between the pinned layer and the free layer, either between the non-magnetic spacer layer and the free layer or between the non-magnetic spacer layer and the pinned layer. While the present disclosure is not so limited, an appreciation of various aspects of the disclosure will be gained through a discussion of the examples provided below.

Figure 1A:
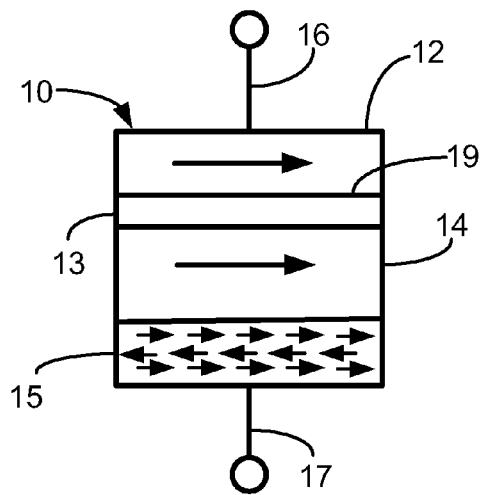
FIG. 1A is a cross-sectional schematic diagram of an illustrative magnetic element with in-plane magnetization orientation in a low resistance state.
Figure 1B:
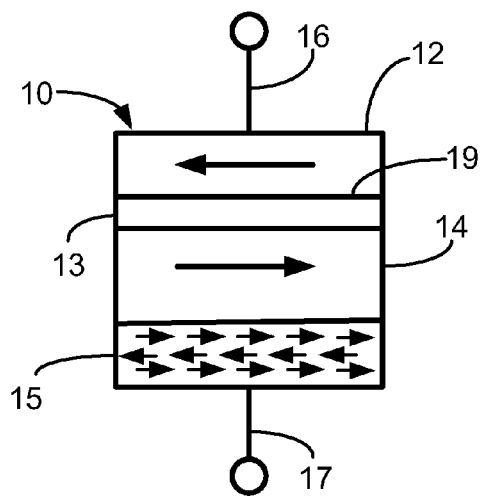
FIG. 1B is a cross-sectional schematic diagram of the magnetic element in a high resistance state.

FIGS. 1A and 1B are cross-sectional schematic diagrams of an illustrative magnetic element 10; in FIG. 1A, element 10 is in the low resistance state, with the magnetization orientations parallel and in FIG. 1B, element 10 is in the high resistance state, with the magnetization orientations anti-parallel. Magnetic element 10 may also be referred to as a variable resistive memory cell or variable resistance memory cell or the like.

Magnetic element 10 includes a ferromagnetic free layer 12 and a ferromagnetic reference (i.e., pinned) layer 14. Ferromagnetic free layer 12 and ferromagnetic pinned layer 14 are separated by a non-magnetic spacer layer 13. Proximate ferromagnetic pinned layer 14 is an antiferromagnetic (AFM) pinning layer 15, which pins the magnetization orientation of ferromagnetic pinned layer 14 by exchange bias with the antiferromagnetically ordered material of pinning layer 15. Examples of suitable pinning materials include PtMn, IrMn, and others. Note that other layers, such as seed or capping layers, are not depicted for clarity. The interface between free layer 12 and non-magnetic spacer layer 13 is identified as interface 19.

Ferromagnetic layers 12, 14 may be made of any useful ferromagnetic (FM) material such as, for example, Fe, Co or Ni and alloys thereof, such as NiFe and CoFe, and ternary alloys, such as CoFeB. Either or both of free layer 12 and pinned layer 14 may be either a single layer or a synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Free layer 12 may be a synthetic ferromagnetic coupled structure, i.e., two ferromagnetic sublayers separated by a metallic spacer, such as Ru or Ta, with the magnetization orientations of the sublayers in parallel directions. Either or both layer 12, 14 are often about 0.1-10 nm thick, depending on the material and the desired resistance and switchability of free layer 12.

If magnetic element 10 is a magnetic tunnel junction cell, non-magnetic spacer layer 13 is an insulating barrier layer sufficiently thin to allow tunneling of charge carriers between pinned layer 14 and free layer 12. Examples of suitable electrically insulating material include oxides material (e.g., $Al_2O_3$, $TiO_x$ or MgO). If magnetic element 10 is a spin-valve cell, non-magnetic spacer layer 13 is a conductive non-magnetic spacer layer. For either a magnetic tunnel junction cell or a spin-valve, non-magnetic spacer layer 13 could optionally be patterned with free layer 12 or with pinned layer 14, depending on process feasibility and device reliability.

The following are various specific examples of magnetic tunnel junction cells. In some embodiments of magnetic element 10, layer 13 is oxide barrier $Ta_2O_5$ (for example, at a thickness of about 0.5 to 1 nanometer) and ferromagnetic free layer 12 and ferromagnetic pinned layer 14 include NiFe, CoFe, or Co. In other embodiments of magnetic tunnel junction cells, layer 13 is GaAs (for example, at a thickness of about 5 to 15 nanometers) and ferromagnetic free layer 12 and ferromagnetic pinned layer 14 include Fe. In yet other embodiments of magnetic tunnel junction cells, layer 13 includes $Al_2O_3$ (for example, a few nanometers thick) and ferromagnetic free layer 12 and ferromagnetic pinned layer 14 include NiFe, CoFe, or Co. In yet other embodiments of magnetic tunnel junction cells, layer 13 includes crystalline MgO layer (e.g., about 1 nm thick) and ferromagnetic free layer 12 and ferromagnetic pinned layer 14 include Fe, CoFeB, NiFe, CoFe, or Co. The dimensions of magnetic element 10 are small, from about 10 to about a few hundred nanometers.

Returning to FIGS. 1A and 1B, a first electrode 16 is in electrical contact with ferromagnetic free layer 12 and a second electrode 17 is in electrical contact with ferromagnetic pinned layer 14 via pinning layer 15. Electrodes 16, 17 electrically connect ferromagnetic layers 12, 14 to a control circuit providing read and write currents through layers 12, 14. The resistance across magnetic element 10 is determined by the relative orientation of the magnetization vectors or magnetization orientations of ferromagnetic layers 12, 14. The magnetization direction of ferromagnetic pinned layer 14 is pinned in a predetermined direction by pinning layer 15 while the magnetization direction of ferromagnetic free layer 12 is free to rotate under the influence of spin torque.

FIG. 1A illustrates magnetic element 10 where the magnetization orientation of ferromagnetic free layer 12 is parallel and in the same direction of the magnetization orientation of ferromagnetic pinned layer 14. FIG. 1B illustrates magnetic element 10 where the magnetization orientation of ferromagnetic free layer 12 is anti-parallel and in the opposite direction of the magnetization orientation of ferromagnetic pinned layer 14.

Switching the resistance state and hence the data state of magnetic element 10 via spin-transfer occurs when a current, under the influence of a magnetic layer of magnetic element 10, becomes spin polarized and imparts a spin torque on free layer 12 of magnetic element 10. When a sufficient level of polarized current and therefore spin torque is applied to free layer 12, the magnetization orientation of free layer 12 can be changed among different directions and accordingly, magnetic element 10 can be switched between the parallel state (i.e., as in FIG. 1A), the anti-parallel state (i.e., as in FIG. 1B), and other states.

Figure 2:
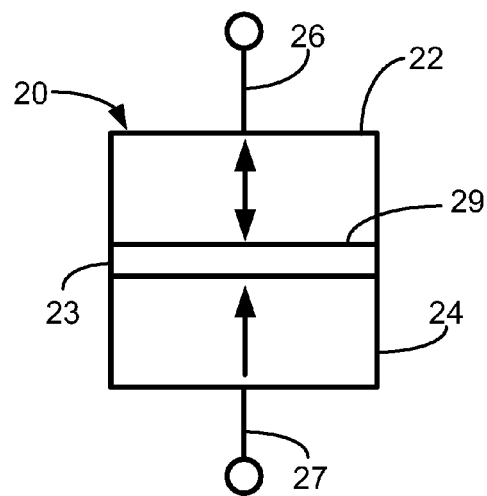
FIG. 2 is a cross-section schematic diagram of an illustrative magnetic element with out-of-plane magnetization orientation.

Similar to magnetic tunnel junction cell 10 of FIG. 1, magnetic tunnel junction cell 20 of FIG. 2 has relatively soft ferromagnetic free layer 22 and a ferromagnetic reference (i.e., fixed or pinned) layer 24 separated by a non-magnetic layer 23. Pinned layer 24 can be a single layer with large coercivity or a layer pinned by a pinning layer, or a synthetic antiferromagnetic (SAF) trilayer, or a SAF pinned by a pinning layer (not illustrated). The interface between free layer 22 and non-magnetic spacer layer 23 is identified as interface 29. A first electrode 26 is in electrical contact with ferromagnetic free layer 22 and a second electrode 27 is in electrical contact with ferromagnetic pinned layer 24. Other layers, such as seed or capping layers, are not depicted for clarity. Electrodes 26, 27 electrically connect ferromagnetic layers 22, 24 to a control circuit providing read and write currents through layers 22, 24. The various elements of cell 20 are similar to the element of cell 10, described above, except that the magnetization orientations of layers 22, 24 are oriented perpendicular to the layer extension rather than in the layer plane.

Free layer 22 and pinned layer 24 each have a magnetization orientation associated therewith, illustrated in FIG. 2, where two opposing magnetization arrows represent a readily switchable magnetization orientation. In some embodiments, magnetic tunnel junction cell 20 is in the low resistance state or "0" data state where the magnetization orientation of free layer 22 is in the same direction of the magnetization orientation of pinned layer 24. In other embodiments, magnetic tunnel junction cell 20 is in the high resistance state or "1" data state where the magnetization orientation of free layer 22 is in the opposite direction of the magnetization orientation of pinned layer 24. In FIG. 2, the magnetization orientation of free layer 22 is undefined.

Similar to cell 10 of FIG. 1, switching the resistance state and hence the data state of magnetic tunnel junction cell 20 via spin-transfer occurs when a current, passing through a magnetic layer of magnetic tunnel junction cell 20, becomes spin polarized and imparts a spin torque on free layer 22. When a sufficient spin torque is applied to free layer 22, the magnetization orientation of free layer 22 can be switched between two opposite directions and accordingly, magnetic tunnel junction cell 20 can be switched between the low resistance state or "0" data state and the high resistance state or "1" data state.

The illustrative spin-transfer torque magnetic elements 10, 20 are used to construct a memory device where a data bit is stored in the spin torque memory cell by changing the relative magnetization state of free layer 12, 22 with respect to pinned layer 14, 24. The stored data bit can be read out by measuring the resistance of element 10, 20 which changes with the magnetization direction of free layer 12, 22 relative to pinned layer 14, 24.

In order for the spin-transfer torque magnetic element 10, 20 to have the characteristics of a non-volatile random access memory, free layer 12, 22 exhibits thermal stability against random fluctuations so that the orientation of free layer 12, 22 is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

In accordance with this disclosure, the magnetic elements include a current confinement layer present between free layer 12, 22 and pinned layer 14, 24, either between free layer 12, 22 and non-magnetic spacer layer 13, 23 or between pinned layer 14, 24 and non-magnetic spacer layer 13, 23. Including a current confinement layer decreases the switching current needed to switch the magnetization orientation of free layer 12, 22. FIGS. 3 through 6 illustrates a magnetic element having a current confinement layer present between the free layer and the pinned layer; FIGS. 3 and 4 illustrate embodiments having a current confinement layer between the free layer and the non-magnetic spacer layer and FIGS. 5 and 6 illustrate embodiments having a current confinement layer between the non-magnetic spacer layer and the pinned layer.

Similar to magnetic element 10 discussed above, magnetic element 30 of FIG. 3 has a ferromagnetic free layer 32 and a ferromagnetic reference (i.e., pinned) layer 34 separated by a non-magnetic spacer layer 33. Proximate ferromagnetic pinned layer 34 is an antiferromagnetic (AFM) pinning layer 35, which pins the magnetization orientation of ferromagnetic pinned layer 34 by exchange bias with the antiferromagnetically ordered material of pinning layer 35. The magnetization orientation of free layer 32 is illustrated as undefined in FIG. 3. Layers such as seed or capping layers are not depicted for clarity. A first electrode 36 is in electrical contact with ferromagnetic free layer 32 and a second electrode 37 is in electrical contact with ferromagnetic pinned layer 34 via pinning layer 35.

Magnetic element 30 includes a current confinement layer 38 present between free layer 32 and pinned layer 34. In the illustrated embodiment, current confinement layer 38 is positioned between free layer 32 and non-magnetic spacer layer 33; in some embodiments, there are no intervening layers between free layer 32 and current confinement layer 38 and between non-magnetic spacer layer 33 and current confinement layer 38, but rather, current confinement layer 38 has an interface with free layer 32 and with non-magnetic spacer layer 33, respectively. Current confinement layer 38 has a first interface 39A with free layer 32 and a second interface 39B with non-magnetic spacer layer 33.

Similar to magnetic element 20 discussed above, magnetic element 40 of FIG. 4 has a ferromagnetic free layer 42 and a ferromagnetic reference (i.e., pinned) layer 44 separated by a non-magnetic spacer layer 43. The magnetization orientation of free layer 42 is illustrated as undefined in FIG. 4. Layers such as seed or capping layers are not depicted for clarity. In some embodiments, however, an in-plane soft magnetic layer (e.g., CoFeB) may be present to improve the TMR ratio of element 40. A first electrode 46 is in electrical contact with ferromagnetic free layer 42 and a second electrode 47 is in electrical contact with ferromagnetic pinned layer 44.

Magnetic element 40 includes a current confinement layer 48 present between free layer 42 and pinned layer 44, particularly positioned between free layer 42 and non-magnetic spacer layer 43; in some embodiments, there are no intervening layers between free layer 42 and current confinement layer 48 and between non-magnetic spacer layer 43 and current confinement layer 48, but rather, current confinement layer 48 has an interface with free layer 42 and with non-magnetic spacer layer 43, respectively. Current confinement layer 48 has a first interface 49A with free layer 42 and a second interface 49B with non-magnetic spacer layer 43.

Current confinement layer 38, 48 limits the path through which electrons may pass between non-magnetic spacer layer 33, 43 to free layer 32, 42, thus increasing the current density in the current path. The increased current density results in an overall lower current needed to switch the magnetization orientation of free layer 32, 42.

Current confinement layer 38, 48 is a porous electrically non-conducting material, such as an insulating or dielectric material. Electrons are able to pass through current confinement layer 38, 48 only in areas void of non-conducting material. These areas void of non-conducting material may have ferromagnetic material (i.e., from free layer 32, 42) or non-magnetic material (i.e., from non-magnetic spacer layer 33, 43) therein; in most embodiments, the void areas having ferromagnetic material therein. The areas void of non-conducting material provide a clean interface between free layer 32, 42 and non-magnetic spacer layer 33, 43, identified as interface 39C in FIGS. 3 and 3A and as interface 49C in FIG. 4. This clean interface 39C, 49C preserves the TMR ratio (e.g., at about 10% to 500%) and maintains spin tunneling efficiency.

The placement of current confinement layer 38, 48 between free layer 32, 42 and non-magnetic spacer layer 33, 43 rather than in a different location between free layer 32, 42 and pinned layer 34, 44 is preferred for various reasons. The portions of free layer 32, 42 that have most impact on switching current are the free layer/barrier interface (see, for example, interface 19 of element 10 of FIG. 1, which is the interface between free layer 12 and non-magnetic spacer layer 13) and that portion of the free layer immediately proximate the non-magnetic layer (see, for example, free layer 12 and non-magnetic spacer layer 13 of element 10 of FIG. 1). If the current confinement layer is spaced from the free layer/barrier interface (e.g., in the middle of the free layer or otherwise away from the non-magnetic layer) the free layer/barrier interface and the free layer immediate proximate the non-magnetic layer experience much less current confinement effect, as compared to having the current confinement layer adjacent non-magnetic spacer layer 33, 43, as according to this disclosure. Additionally, having a current confinement layer in the middle of free layer or otherwise not at the free layer/barrier interface will impact the magnetic coupling of the entire free layer. This will constrain any optimization of the free layer as it affects device performance. Still further, having a current confinement layer between free layer 32, 42 and non-magnetic spacer layer 33, 43 provides freedom to free layer material selection and process optimization.

Similar to magnetic element 10 discussed above, magnetic element 50 of FIG. 5 has a ferromagnetic free layer 52 and a ferromagnetic reference (i.e., pinned) layer 54 separated by a non-magnetic spacer layer 53. Proximate ferromagnetic pinned layer 54 is an antiferromagnetic (AFM) pinning layer 55, which pins the magnetization orientation of ferromagnetic pinned layer 54 by exchange bias with the antiferromagnetically ordered material of pinning layer 55. The magnetization orientation of free layer 52 is illustrated as undefined in FIG. 5. Layers such as seed or capping layers are not depicted for clarity. A first electrode 56 is in electrical contact with ferromagnetic free layer 52 and a second electrode 57 is in electrical contact with ferromagnetic pinned layer 54 via pinning layer 55. Unlike magnetic element 10 of FIGS. 1A and 1B, however, magnetic element 50 is oriented with free layer 52 at the bottom of the illustrated layer stack and pinning layer 55 at the top. This configuration is due to the method of manufacturing element 50, where free layer 52 is formed first, non-magnetic layer 53 is applied over free layer 52, etc. It should be noted that the designations of "top" and "bottom" are only used for convenience herein and any stack structure with the discussed relative ordering of layers is within the scope of this invention.

Magnetic element 50 includes a current confinement layer 58 present between non-magnetic layer 53 and pinned layer 54. In some embodiments, there are no intervening layers between pinned layer 54 and current confinement layer 58 and between non-magnetic spacer layer 53 and current confinement layer 58, but rather, current confinement layer 58 has an interface with non-magnetic spacer layer 53 and with pinned layer 54, respectively. Current confinement layer 58 has a first interface 59A with non-magnetic spacer layer 53 and a second interface 59B with pinned layer 54.

Similar to magnetic element 20 discussed above, magnetic element 60 of FIG. 6 has a ferromagnetic free layer 62 and a ferromagnetic reference (i.e., pinned) layer 64 separated by a non-magnetic spacer layer 63. The magnetization orientation of free layer 62 is illustrated as undefined in FIG. 6. Layers such as seed or capping layers are not depicted for clarity. In some embodiments, however, an in-plane soft magnetic layer (e.g., CoFeB) may be present to improve the TMR ratio of element 60. A first electrode 66 is in electrical contact with ferromagnetic free layer 62 and a second electrode 67 is in electrical contact with ferromagnetic pinned layer 64. Unlike magnetic element 20 of FIG. 2, however, magnetic element 60 is oriented with free layer 62 at the bottom of the illustrated layer stack and pinned layer 64 at the top. This configuration is due to the method of manufacturing element 60, where free layer 62 is formed first, non-magnetic layer 63 is applied over free layer 62, etc.

Magnetic element 60 includes a current confinement layer 68 present between non-magnetic spacer layer 63 and pinned layer 64. In some embodiments, there are no intervening layers between pinned layer 64 and current confinement layer 48 and between non-magnetic spacer layer 43 and current confinement layer 48, but rather, current confinement layer 68 has an interface with non-magnetic spacer layer 63 and with pinned layer 64, respectively. Current confinement layer 68 has a first interface 69A with non-magnetic spacer layer 63 and a second interface 69B with pinned layer 64.

Similar to current confinement layer 38, 48 described above, current confinement layer 58, 68 limits the path through which electrons may pass between pinned layer 54, 64 and non-magnetic spacer layer 53, 63, thus increasing the current density in the current path. The increased current density results in an overall lower current needed to switch the magnetization orientation of free layer 52, 62.

Current confinement layer 58, 68 is a porous electrically non-conducting material, such as an insulating or dielectric material. Electrons are able to pass through current confinement layer 58, 68 only in areas void of non-conducting material. These areas void of non-conducting material may have ferromagnetic material (i.e., from pinned layer 54, 64) or non-magnetic material (i.e., from non-magnetic spacer layer 53, 63) therein; in most embodiments, the void areas having ferromagnetic material therein. The areas void of non-conducting material provide a clean interface between non-magnetic spacer layer 53, 63 and pinned layer 54, 64, identified as interface 59C in FIGS. 5 and 5A and as interface 69C in FIG. 6. This interface 59C, 69C preserves the TMR ratio (e.g., at about 10% to 500%) and maintains spin tunneling efficiency.

The placement of current confinement layer 58, 68 between non-magnetic spacer layer 53, 63 and pinned layer 54, 64 has generally the same benefits as positioning the current confinement layer between the non-magnetic spacer layer and the free layer (as for elements 30, 40, described above). It is desirable to position current confinement layer 58, 68 at the interface between non-magnetic spacer layer 53, 63 and pinned layer 54, 64 rather than in a different location, such as within the pinned layer.

Figure 7:
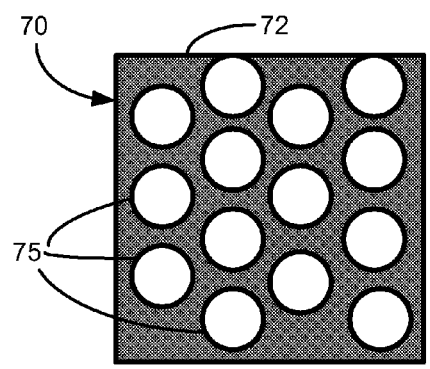
FIG. 7 is a schematic top view of a porous layer suitable for use as a current confinement layer.

An example of a porous layer suitable for use as current confinement layer 38, 48, 58, 68 is shown in FIG. 7 as apertured material 70. Apertured material 70 has an extension of non-conducting material 72 having at least one, but usually a plurality of, apertures 75 extending through material 70. In the illustrated embodiment, apertures 75 are non-random and precisely spaced within non-conducting material 72; in alternate embodiments, the apertures may be randomly ordered and/or with inconsistent spacing therebetween. For material 70 of FIG. 7, each aperture 75 has a generally circular shape with a diameter of about 2-200 Angstroms. Other apertured materials suitable for use as a current confinement layer may have apertures that are oval, square, rectangular, irregular, etc. with a largest dimension of about 2-200 Angstroms, in some embodiments about 5-100 Angstroms, and in some other embodiments about 10-30 Angstroms.

Apertures 75 occupy at least about 10% and no more than about 90% of the area of material 70, leaving at least about 10% and no more than about 90% of material 70 being non-conducting material 72. In some embodiments, apertures 75 occupy about 25%-75% of the surface area of material 70, and in other embodiments, about 40%-60%. The thickness of apertured layer material 70 may be, for example 2-20 Angstroms, in some embodiments, about 3-5 Angstroms. When apertured material 70 is incorporated into a magnetic element, such as magnetic element 30 of FIG. 3 or magnetic element 40 of FIG. 4, apertures 75 may be filled by ferromagnetic material from free layer 32, 42 or by non-magnetic material from non-magnetic spacer layer 33, 43; in most embodiments, apertures 75 have ferromagnetic material therein. Similarly, when apertured material 70 is incorporated into a magnetic element, such as magnetic element 50 of FIG. 5 or magnetic element 60 of FIG. 6, apertures 75 may be filled by ferromagnetic material from pinned layer 54, 64 or by non-magnetic material from non-magnetic spacer layer 53, 63; in most embodiments, apertures 75 have ferromagnetic material therein.

Figure 8:
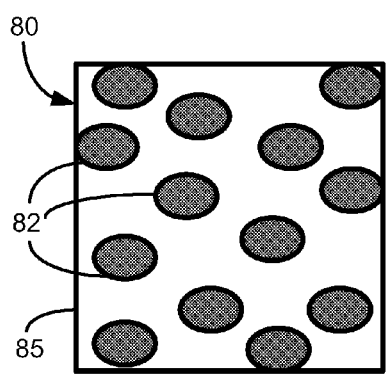
FIG. 8 is a schematic top view of a second embodiment of a porous layer suitable for use as a current confinement layer.

Another example of a porous layer suitable for use as current confinement layer 38, 48, 58, 68 is shown in FIG. 8 as dotted material 80. Dotted material 80 is composed of at least one, but usually a plurality of, discrete regions (e.g., islands, dots, etc.) of non-conducting material 82. Surrounding non-conducting material 82 is area 85 devoid of non-conducting material 82. Non-conducting material 82 may have generally any shape, such as circular, oval, square, rectangular, irregular, etc., depending on the mode of forming the discrete areas of non-conducting material 82. Non-conducting material 82 may be domed. Each area of non-conducting material 82 has a largest dimension of about 2-200 Angstroms, in some embodiments about 5-100 Angstroms, and in some other embodiments about 10-30 Angstroms. Depending on the mode of forming the discrete areas of non-conducting material 82, the shape and size of non-conducting material 82 may vary greatly. In an alternate embodiment, non-conducting material 82 may be interconnected, for example, forming a lattice or matrix of non-conducting material.

Non-conducting material 82 occupies at least about 10% and no more than about 90% of the area of dotted material 80, leaving at least about 10% and no more than about 90% of material 80 being devoid area 85. In some embodiments, non-conducting material 82 occupies about 25%-75% of the surface area of material 80, and about 40%-60% in other embodiments. The height or thickness of non-conducting material 82 may be, for example 2-20 Angstroms, in some embodiments, about 3-5 Angstroms.

Figure 8A:
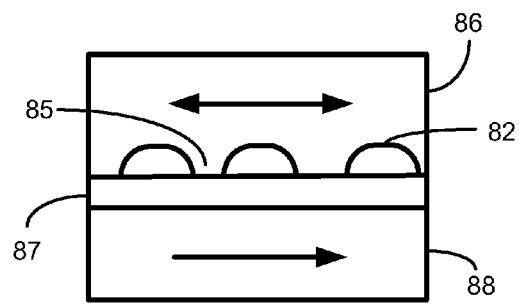
FIG. 8A is a schematic side view of the porous layer of FIG. 8 incorporated into an illustrative magnetic element.

FIG. 8A illustrates dotted material 80 incorporated into a magnetic element having a ferromagnetic free layer 86, a ferromagnetic pinned layer 88 and a non-magnetic spacer layer 87 therebetween. When dotted material 80 is used in the magnetic element of FIG. 8A or any of the other magnetic elements of this disclosure, devoid area 85 is filled by ferromagnetic material from free layer 86 or by non-magnetic material from non-magnetic spacer layer 87; in most embodiments, devoid area 85 has ferromagnetic material therein.

Apertures 75 or devoid area 85 may extend linearly through porous material 70 or dotted material 80, respectively, directly from non-magnetic spacer layer 33, 43 to free layer 38, 48 or from non-magnetic spacer layer 53, 63 to pinned layer 54, 64. Alternately, apertures 75 or devoid area 85 may have a tortuous path through porous material 70 or dotted material 80, respectively.

As indicated above, materials 72, 82 are electrically insulating and non-conductive. In some embodiments, material 72, 82 is a dielectric. Examples of suitable materials for material 72, 82 include alumina ($Al_2O_3$), zirconia ($ZrO_2$), silicon dioxide ($SiO_2$), silicon nitride ($Si_3N_4$), and composites, such as silicon oxide and carbon ($SiO_xC$). Both apertured material 70 and dotted material 80 may be formed in situ, directly on non-magnetic spacer layer 23 during the formation of magnetic element 20.

For example, apertured material 70 may be formed during the forming of magnetic element 30, 40, 50, 60 or formed as a layer that is subsequently applied onto non-magnetic spacer layer 33, 43, 53, 63. For example, apertured material 70 can be formed by depositing a porous non-conductive film having pores with diameters of 5-100 Angstroms, or with diameters of 10-30 Angstroms. An example of such as material is mesoporous silica synthesized with a triblock copolymer. As another example, a porous dielectric or organic film, such as a silicon oxide-carbon composite, can be deposited, with optional subsequent oxidation.

To form an embodiment of dotted material 80, in one example, a thin metal or metal alloy film can be deposited directly onto non-magnetic spacer layer 33, 43, 53, 63 as discontinuous and discrete islands. These islands are then oxidized, to create a non-conductive material (e.g., metal oxide) at least on the exposed surface of the islands. As another example, a thin dielectric or organic film can be deposited directly as discontinuous and discrete islands. As another, third, example, a low viscosity liquid or vapor with high surface contact angle can be deposited. The surface tension will form discrete and discontinuous droplets, for example, on non-magnetic spacer layer 33, 43, 53, 63, which are then heated to form solid non-conductive islands.

The magnetic elements of this disclosure (e.g., magnetic elements 30, 40, 50, 60) may be made by well-known thin film building and removal techniques such as chemical vapor deposition (CVD), physical vapor deposition (PVD), atomic layer deposition (ALD), spin coating, photolithography, dry etching, wet etching, or ion milling. The porous non-conducting current confinement layer (e.g., current confinement layer 38, 48, 58, 68) can be made by depositing material onto the non-magnetic layer (e.g., non-magnetic spacer layer 33, 43, 53, 63). For both apertured material 70 and dotted material 80 that are suitable as porous non-conducting current confinement layer 38, 48, 58, 68, physical patterning (e.g., masking) is not necessarily needed to form the areas void of non-conducting material 72, 82.

FIG. 9A is a flow diagram of one possible process for making a magnetic element having a current confinement layer between the non-magnetic layer and the free layer, such as magnetic element 30, 40. Method 90A includes first forming a pinned layer at Step 91A, over which is applied a non-magnetic layer at Step 92A. A porous current confinement layer is formed over the non-magnetic layer in Step 93A, for example, either applied as a previously formed layer or formed directly on the non-magnetic layer. A free layer is formed over the current confinement layer in Step 94A, filling the porous layer, as appropriate, with the free layer material. It is understood that alternate processes for making a magnetic element having a current confinement layer between the non-magnetic layer and the free layer are possible.

FIG. 9B is a flow diagram of one possible process for making a magnetic element having a current confinement layer between the non-magnetic layer and the pinned layer, such as magnetic element 50, 60. Method 90B includes first forming a free layer at Step 91B, over which is applied a non-magnetic layer at Step 92B. A porous current confinement layer is formed over the non-magnetic layer in Step 93B, for example, either applied as a previously formed layer or formed directly on the non-magnetic layer. A pinned layer is formed over the current confinement layer in Step 94B, filling the porous layer, as appropriate, with the pinned layer material. It is understood that alternate processes for making a magnetic element having a current confinement layer between the non-magnetic layer and the pinned layer are possible.

The magnetic elements of this disclosure (e.g., magnetic element 30, 40, 50, 60 and variations thereof) can be utilized in a memory device. A plurality of magnetic elements 30, 40, 05, 60 are arranged and connected in an array with bit lines and word lines in a common way.

Thus, embodiments of the MAGNETIC MEMORY WITH POROUS NON-CONDUCTIVE CURRENT CONFINEMENT LAYER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic element comprising:
    a ferromagnetic pinned layer having a pinned magnetization orientation, a ferromagnetic free layer having a changeable magnetization orientation, and a tunnel barrier layer therebetween; and
    a porous non-electrically conducting current confinement layer between the ferromagnetic free layer and the ferromagnetic pinned layer, the porous non-electrically conducting current confinement layer present between the ferromagnetic free layer and the tunnel barrier layer and providing an interface between the ferromagnetic free layer and the tunnel barrier layer, or the porous non-electrically conducting current confinement layer present between the ferromagnetic pinned layer and the tunnel barrier layer and providing an interface between the ferromagnetic pinned layer and the tunnel barrier layer, with the porous non-electrically conducting current confinement layer having a thickness of 2 to 20 Angstroms.

2. The magnetic element of claim 1 wherein the porous non-electrically conducting current confinement layer comprises a non-electrically conducting material with a plurality of pores therein.

3. The magnetic element of claim 2 wherein the plurality of pores have a diameter of 2 to 200 Angstroms and are circular shaped.

4. The magnetic element of claim 2 wherein the pores are orderly arranged.

5. The magnetic element of claim 1 wherein the porous non-electrically conducting current confinement layer comprises a plurality of islands of non-electrically conducting material.

6. The magnetic element of claim 5 wherein the plurality of islands have a diameter of 2 to 200 Angstroms and are dome shaped.

7. The magnetic element of claim 5 wherein the islands are randomly arranged.

8. The magnetic element of claim 1 wherein the porous non-electrically conducting current confinement layer comprises silica.

9. The magnetic element of claim 1 wherein the porous non-electrically conducting current confinement layer comprises a porous non-electrically conducting material comprising an insulating or dielectric material.

10. The magnetic element of claim 1 wherein the porous non-electrically conducting current confinement layer is present between the ferromagnetic free layer and the tunnel barrier layer.

11. The magnetic element of claim 1 wherein the pinned magnetization orientation and the changeable magnetization orientation are both out-of-plane.

12. A magnetic element comprising:
    a ferromagnetic pinned layer having a pinned magnetization orientation;
    a tunnel barrier layer;
    a ferromagnetic free layer having a changeable magnetization orientation;
    a non-electrically conducting current confinement layer comprising non-electrically conducting material and areas devoid of non-electrically conducting material;
    a first interface between the tunnel barrier layer and the non-electrically conducting current confinement layer;
    a second interface either between the non-electrically conducting current confinement layer and the ferromagnetic free layer or between the non-electrically conducting current confinement layer and the ferromagnetic pinned layer; and
    a third interface either between the tunnel barrier layer and the ferromagnetic free layer or between the tunnel barrier layer and the ferromagnetic pinned layer, present in areas devoid of non-electrically conducting material.

13. The magnetic element of claim 12 wherein the non-electrically conducting current confinement layer has a thickness of 2 to 20 Angstroms.

14. The magnetic element of claim 12 wherein the second interface is between the non-electrically conducting current confinement layer and the ferromagnetic free layer, and the third interface is between the tunnel barrier layer and the ferromagnetic free layer.

15. The magnetic element of claim 12 wherein the pinned magnetization orientation and the changeable magnetization orientation are both out-of-plane.

16. A method of making a spin torque magnetic element having a current confinement layer, the method comprising:
    forming a ferromagnetic pinned layer and pinning a magnetic orientation of the ferromagnetic pinned layer;
    forming a tunnel barrier layer over the ferromagnetic pinned layer;
    forming a porous non-electrically conducting current confinement layer over and in contact with the tunnel barrier layer; and
    forming a ferromagnetic free layer over the porous non-electrically conducting current confinement layer.

17. The method of claim 16 wherein forming a ferromagnetic free layer over the porous non-electrically conducting current confinement layer comprises:
    filling a set of pores in the porous non-electrically conducting current confinement layer with a ferromagnetic free layer material.

18. The method of claim 16 wherein forming the porous non-electrically conducting current confinement layer over and in contact with the tunnel barrier layer comprises:
    depositing droplets of dielectric or organic material over the non-magnetic spacer.

19. The method of claim 16 wherein forming the porous non-electrically conducting current confinement layer over and in contact with the tunnel barrier layer comprises:
    coating a porous film of dielectric or organic material over the tunnel barrier layer.

* * * * *